(12) United States Patent
Lee et al.

(10) Patent No.: US 6,770,525 B2
(45) Date of Patent: Aug. 3, 2004

(54) METHOD OF FABRICATING CAPACITORS FOR SEMICONDUCTOR DEVICES

(75) Inventors: Kee Jeung Lee, Seoul (KR); Dong Jun Kim, Kyoungki-do (KR)

(73) Assignee: Hyundai Electronics Co., Ltd., Ichon (KR)

( * ) Notice: Subject to any disclaimer, the term of this patent is extended or adjusted under 35 U.S.C. 154(b) by 0 days.

(21) Appl. No.: 09/751,453

(22) Filed: Jan. 2, 2001

(65) Prior Publication Data

US 2002/0019110 A1 Feb. 14, 2002

(30) Foreign Application Priority Data

Dec. 31, 1999 (KR) ........................................ 1999-68094

(51) Int. Cl.[7] .................. H01L 21/8242; H01L 21/331; H01G 4/228
(52) U.S. Cl. ....................... 438/239; 438/240; 438/394; 438/396; 438/398; 361/306.3
(58) Field of Search ............................... 438/239, 240, 438/394, 396, 398; 361/306.3

(56) References Cited

U.S. PATENT DOCUMENTS

| | | | | |
|---|---|---|---|---|
| 4,596,594 A | * | 6/1986 | Yang et al. ................. 438/396 |
| 5,352,623 A | * | 10/1994 | Kamiyama .................. 437/52 |
| 5,439,660 A | * | 8/1995 | Jansen et al. ............... 423/263 |
| 5,468,687 A | * | 11/1995 | Carl et al. .................. 437/325 |
| 5,486,488 A | * | 1/1996 | Kamiyama .................. 437/60 |
| 5,508,221 A | * | 4/1996 | Kamiyama .................. 437/60 |
| 5,668,040 A | * | 9/1997 | Byun ........................ 438/396 |
| 5,693,102 A | * | 12/1997 | Jansen et al. ................. 8/506 |
| 5,910,880 A | * | 6/1999 | DeBoer et al. ............. 361/311 |
| 6,143,598 A | * | 11/2000 | Martin et al. ............... 438/240 |
| 6,218,260 B1 | * | 4/2001 | Lee et al. ................... 438/398 |
| 6,287,910 B2 | * | 9/2001 | Lee et al. ................... 438/240 |
| 6,294,807 B1 | * | 9/2001 | Chittipeddi et al. ......... 257/310 |
| 6,316,307 B1 | * | 11/2001 | Lee et al. ................... 438/219 |
| 6,337,291 B1 | * | 1/2002 | Park et al. .................. 438/785 |
| 6,338,995 B1 | * | 1/2002 | Hwang et al. .............. 438/240 |
| 6,340,622 B1 | * | 1/2002 | Lee et al. ................... 438/396 |
| 6,344,418 B1 | * | 2/2002 | Ping et al. .................. 438/753 |

FOREIGN PATENT DOCUMENTS

| JP | 2001-57414 | * | 2/2001 |
|---|---|---|---|
| JP | 2001-203330 | * | 7/2001 |

* cited by examiner

*Primary Examiner*—Long Pham
*Assistant Examiner*—Shrininvas H. Rao
(74) *Attorney, Agent, or Firm*—Pillsbury Winthrop LLP

(57) ABSTRACT

Disclosed is a method for fabricating capacitors for semiconductor devices. This method includes the steps of forming a lower electrode on an understructure of a semiconductor substrate, depositing an amorphous TaON thin film over the lower electrode, annealing the deposited amorphous TaON thin film in an $NH_3$ atmosphere, and repeating the deposition of the amorphous TaON thin film and the annealing of the deposited amorphous TaON thin film at least one time, thereby forming a TaON dielectric film having a multi-layer structure, and forming an upper electrode over the TaON dielectric film. The TaON dielectric film having a multi-layer structure exhibits a dielectric constant that is superior to those of conventional dielectric films. Accordingly, the TaON dielectric film of the invention can be used for capacitors in next generation semiconductor memory devices of grade 256 MB and higher.

19 Claims, 3 Drawing Sheets

METHOD OF FABRICATING CAPACITORS FOR SEMICONDUCTOR DEVICES

BACKGROUND OF THE INVENTION

1. Field of the Invention

The present invention relates to a method for fabricating capacitors for semiconductor devices and, more particularly, to a method for fabricating capacitors that exhibit improved electrical characteristics and are capable of ensuring the capacitance levels required for advanced semiconductor device.

2. Description of the Related Art

In order to manufacture semiconductor devices having even higher degrees of integration, active research and development activities are being directed toward reducing cell area and reducing device operating voltages.

Although high degrees of integration result in greatly decreased capacitor area, the charge capacity required for proper operation of a memory device remains essentially the same. This requirement means that the capacitance for a given unit area must be increased.

Accordingly, various methods of ensuring sufficient capacitance for DRAM capacitors have been proposed. For example, methods of increasing the area of a capacitor by modifying the physical structure of the capacitor to form a three-dimensional structure such as a cylinder or reducing the thickness of a dielectric film have been used until recently.

Recently, research has also been conducted to provide a dielectric film having a NO (Nitride-Oxide) structure or an ONO (Oxide-Nitride-Oxide) structure in place of the conventional silicon oxide. Other alternative dielectric films that have been considered include $Ta_2O_5$ or BST ($BaSrTiO_3$) that ensure a high capacitance providing an increased dielectric constant (typically 20 to 25).

However, capacitors using an NO or ONO dielectric film are generally considered inadequate for ensuring the capacitance required for next generation memories of 256 M or more. For this reason, research and development projects focussing on next generation dielectric materials, for example $Ta_2O_5$, are being pursued.

In the case of a $Ta_2O_5$ thin film, substitutional Ta atoms inevitably exist in the thin film due to composition ratio differences between Ta and O resulting from unstable stoichiometry within the thin film.

Furthermore, a reaction between the organic component of $Ta(OC_2H_5)_5$, which is an organic precursor of $Ta_2O_5$, with $O_2$ gas (or $N_2O$ gas) occurs during the formation of the $Ta_2O_5$ dielectric film, thereby producing impurities such as, carbon (C), carbon compounds ($CH_4$ and $C_2H_4$), and water ($H_2O$) that are incorporated into the film. As a result of the contaminants, leakage current tends to increase and the dielectric characteristics tend to be degraded in the resulting capacitor.

Although the impurities existing in the $Ta_2O_5$ thin film may be removed by conducting a low-temperature heat treatment two or three times, (for example, a plasma $N_2O$ or UV-$O_3$ treatment) these processes can be complex and their results unreliable. Furthermore, these processes have a drawback in that they will induce oxidation of the lower electrode at its interface with the $Ta_2O_5$ thin film.

SUMMARY OF THE INVENTION

The present invention has been made in view of the above mentioned problems involved in the related prior art, and an object of the invention is to provide a method for fabricating capacitors of a semiconductor device that will improve the electrical characteristics of the resulting capacitors while ensuring a level of capacitance required in the semiconductor device.

Another object of the invention is to provide a method for fabricating capacitors for semiconductor devices, that will tend to remove impurities, from a dielectric film, that would generate leakage currents, thereby forming a high quality dielectric film.

Another object of the invention is to provide a method for fabricating capacitors for semiconductor devices, that can eliminate prior art processes necessary to increase the surface area of a lower electrode in order to ensure sufficiently high capacitance, thereby simultaneously reducing the number of unit processing steps, the processing time, and the manufacturing costs.

In accordance with one embodiment, the present invention provides a method for fabricating capacitors for semiconductor devices, comprising the steps of: forming a lower electrode on a semiconductor substrate; forming an amorphous TaON thin film over the lower electrode, annealing the deposited amorphous TaON thin film in an $NH_3$ atmosphere, forming a second amorphous TaON thin film and the annealing the amorphous TaON thin film at least once more, thereby forming a TaON dielectric film having a multi-layer structure; and forming an upper electrode over the TaON dielectric film.

In accordance with another embodiment, the present invention provides a method for fabricating capacitors for semiconductor devices, comprising the steps of: forming a lower electrode on of a semiconductor substrate; forming an amorphous TaON thin film over the lower electrode, annealing the amorphous TaON thin film in an $NH_3$ atmosphere, forming a second amorphous TaON thin film and annealing the amorphous TaON thin film twice, thereby forming a TaON dielectric film having a multi-layer structure; and forming an upper electrode over the TaON dielectric film.

In accordance with another embodiment, the present invention provides a method for fabricating capacitors for semiconductor devices, comprising the steps of: forming a lower electrode on of a semiconductor substrate; nitriding an upper surface of the lower electrode in an $NH_3$ atmosphere; forming an amorphous TaON thin film over the lower electrode, annealing the amorphous TaON thin film in an $NH_3$ atmosphere, forming a second amorphous TaON thin film and annealing the amorphous TaON thin film at least once more, thereby forming a TaON dielectric film having a multi-layer structure; and forming an upper electrode over the TaON dielectric film.

BRIEF DESCRIPTION OF THE DRAWINGS

The above objects, and other features and advantages of the present invention will become more apparent after a reading of the following detailed description when taken in conjunction with the figures.

DESCRIPTION OF THE PREFERRED EMBODIMENTS

Figure 1:
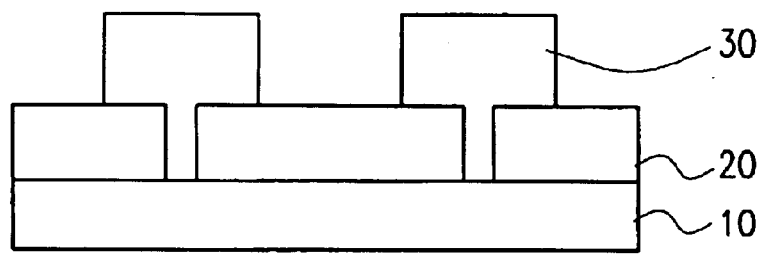
FIGS. 1 to 4 are cross-sectional views respectively illustrating sequential processing steps of a method for fabricating capacitors of a semiconductor device including a multi-layer TaON thin film in accordance with the present invention.

In order to fabricate capacitors according to the present invention, a semiconductor substrate 10, which may be a silicon substrate, is first prepared, as shown in FIG. 1. Although not shown, the silicon substrate 10 is typically formed with gate electrodes and sources/drains at respective active regions as well as other structures and regions necessary for device operation.

Thereafter, a material selected from undoped silicate glass (USG), borophosphosilicate glass (BPSG), and SiON is deposited over the silicon substrate 10. The deposited layer is then surface-polished using a chemical mechanical polishing process (CMP), thereby forming an interlayer insulating film 20.

In order to connect each capacitor to an associated one of the active regions of the silicon substrate 10, the interlayer insulating film 20 is then selectively removed in accordance with conventional photolithography and etch processes, to form contact holes (not shown).

Subsequently, a conductive material such as doped polysilicon or amorphous doped polysilicon is deposited over the resulting structure to bury the contact holes. The deposited conductive material layer is selectively removed again using conventional photolithography and etch processes, to form lower electrodes 30 on respective portions of the interlayer insulating film 20 and corresponding to the contact holes.

The lower electrodes may have a single-layer structure comprising doped polysilicon or metal or have a multi-layer structure consisting of laminated layers made of one or more types of these materials. Similarly, the upper electrodes that will be subsequently formed may have the same structure or a different structure than that of the lower electrodes.

If used, the metal may comprise one or more materials selected from TiN, Ti, TaN, W, WN, WSi, Ru, $RuO_2$, Ir, and Pt.

Furthermore, nothing in the present invention prevents the lower electrodes from having a structure that is a simple stack shape or more complex structure such as a cylinder shape, a fin shape, and a stack cylinder shape.

In order to increase the area of each lower electrode 30, the surface of the lower electrode 30 may also have a hemi-spherical grain (HSG) structure providing surface irregularities.

Figure 2:
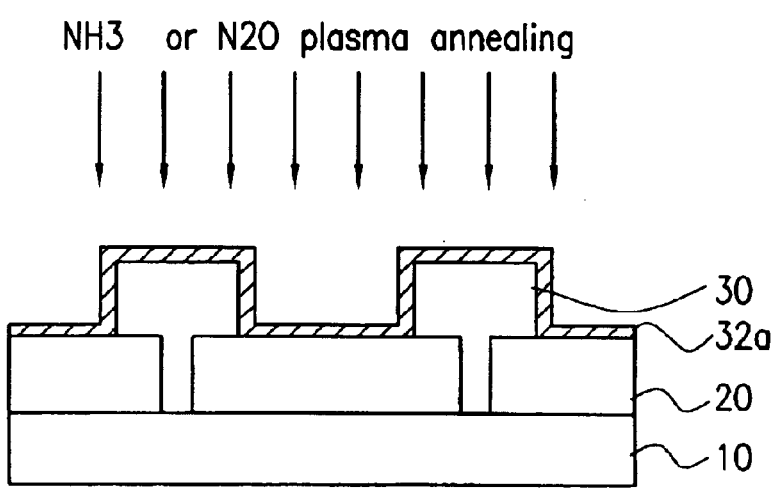
Figure 3:
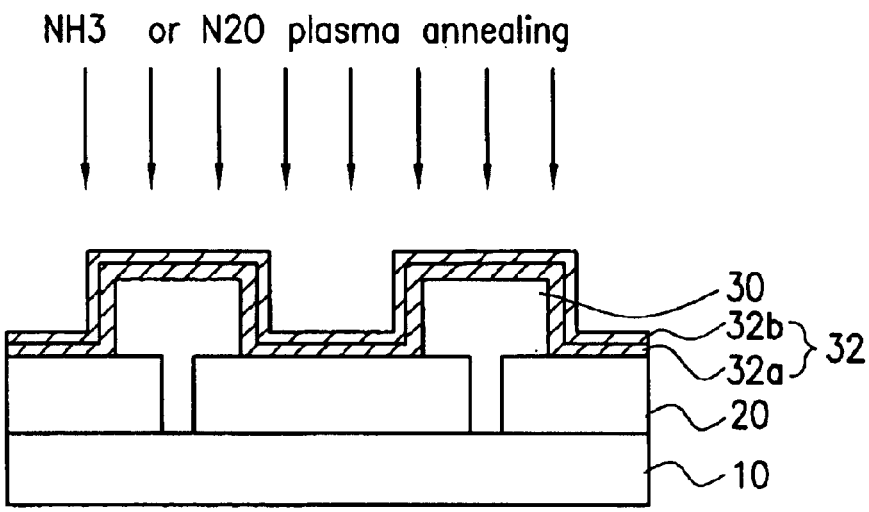

Thereafter, an amorphous TaON film is deposited over the upper surface of the lower electrode 30, as shown in FIGS. 2 and 3. This amorphous TaON film is then subjected to an annealing process. The steps of depositing an amorphous TaON film and annealing the deposited film are repeated at least one time, thereby forming a TaON dielectric film 32 having a multi-layer structure.

Preferably, the amorphous TaON film is formed in a low-pressure chemical vapor (LPCVD) chamber that is maintained at a temperature of 300 to 600° C. under conditions that will include a chemical reaction at the surface of the wafer while suppressing a gas phase reaction.

Prior to the deposition the first of the multiple TaON thin films that will form the amorphous TaON dielectric film 32, any natural oxide film and particles possibly present on the surface of each lower electrode 30 are preferably removed using an in-situ dry cleaning process using vapor selected from HF, $SiF_6$, and $NF_6$, and/or an ex-situ wet cleaning process using an HF solution. In FIG. 3, the first TaON thin film is denoted by the reference numeral 32a.

Furthermore, the interface of the wafer may also be cleaned using a $NH_4OH$ solution, $H_2SO_4$ solution, or a combination thereof before and/or after the cleaning process using the HF compound. In this case, it is possible to remove foreign matter present before and/or after the HF cleaning process to improve the uniformity of the resulting film and improve yield and reliability.

Also, the lower electrodes are preferably cleaned in order to prevent or suppress the formation of an interface oxide film between the polysilicon of the lower electrodes 30 and the first amorphous TaON thin film 32a. Preferably, the surface of each lower electrode 30 is subjected to a nitriding treatment using in-situ plasma in an $NH_3$ atmosphere for 1 to 10 minutes prior to any deposition of the TaON film.

Another technique for preventing the formation of a non-uniform natural oxide film on the lower electrodes and thereby prevent the subsequent generation of leakage current at the lower electrodes, involves feeding the wafer into a low-pressure chemical vapor deposition (LPCVD) chamber under a low pressure of typically less than 10 torr, and subjecting the wafer to an oxidation process using plasma in an in-situ $H_2O$ atmosphere to homogeneously oxidize the surface of the lower electrodes, to form an exceedingly thin but uniform oxide film (not shown) having a thickness of 10 Å or less.

After the surface of the lower electrode has been suitably prepared, a first amorphous TaON thin film 32a is deposited at a temperature of 300 to 600° C. The TaON film is then subjected to plasma annealing in an $NH_3$ or $N_2O$ atmosphere, as shown in FIG. 2.

Thereafter, a second amorphous TaON thin film 32b is deposited over the first amorphous TaON thin film 32a. Ta atoms, carbon, and organic contaminants existing in the first and second amorphous TaON thin films 32a and 32b are effectively removed using an oxidation process. Thus, a high dielectric constant of, for example, 30 to 100, can be obtained.

For the deposition of the amorphous TaON thin films, an organometallic Ta compound, such as $Ta(OC_2H_5)_5$, preferably having a purity of at least 99.99%, is supplied, preferably through a mass flow controller (MFC) at a rate of 300 mg/minute or less, into an evaporator or evaporating tube that is maintained at a temperature of 150 to 200° C. to form the Ta chemical vapor.

The evaporator, as well as any orifice, nozzle, and any supply tubes that provide a flow path for the Ta chemical vapor between the evaporator and the deposition chamber, are preferably maintained at a temperature of 150 to 200° C. to prevent a condensation of Ta chemical vapor.

In accordance with this method, the chemical vapor of $Ta(OC_2H_5)_5$ is supplied in a desired amount into the low-pressure chemical vapor deposition (LPCVD) chamber, along with a desired amount of $NH_3$ reaction gas (ranging from 10 sccm to 500 sccm). The supplied Ta chemical vapor and reaction gas are induced to produce a surface reaction in the LPCVD chamber at a pressure of 100 torr or less to produce the desired amorphous TaON thin film on the lower electrodes 30.

The reaction gas containing the Ta chemical vapor may be directed onto the wafer in a vertical direction using a showerhead or other inlet assembly mounted in an upper portion of the LPCVD chamber. Alternatively, the reaction gas may be introduced into the LPCVD chamber using one or more injectors mounted to the upper or side portion of the chamber so that the gas moves through the chamber in a parabolic or counter flow fashion.

The deposited first and second TaON thin films 32a and 32b are then subjected to a plasma process in an $NH_3$ or $N_2O$ atmosphere, or subjected to a low-temperature annealing process in a UV-$O_3$ atmosphere.

Preferably, the annealing process is conducted in an atmosphere of $N_2O$, $O_2$, or $N_2$ at a temperature of 650 to 950° C., using an electric furnace or a rapid thermal process.

Figure 4:
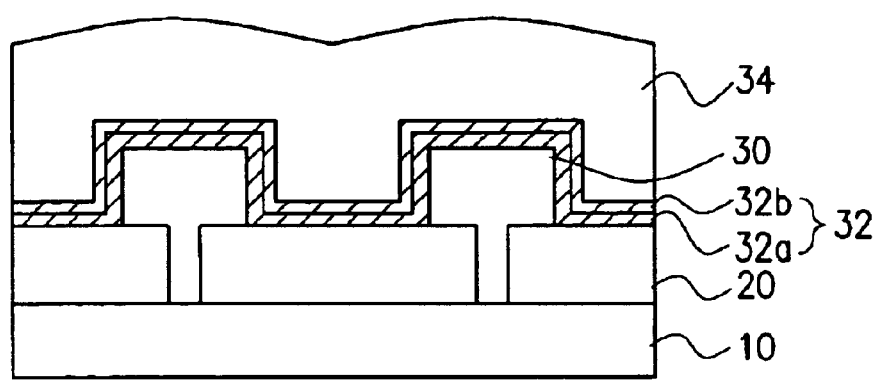

Thereafter, a conductive doped polysilicon layer is deposited over the multilayer TaON dielectric film 32, as shown in FIG. 4. The deposited conductive doped polysilicon layer is then patterned to form upper electrodes 34. Thus, the fabrication of capacitors having a silicon-insulator-silicon (SIS) structure is completed.

Figure 5:
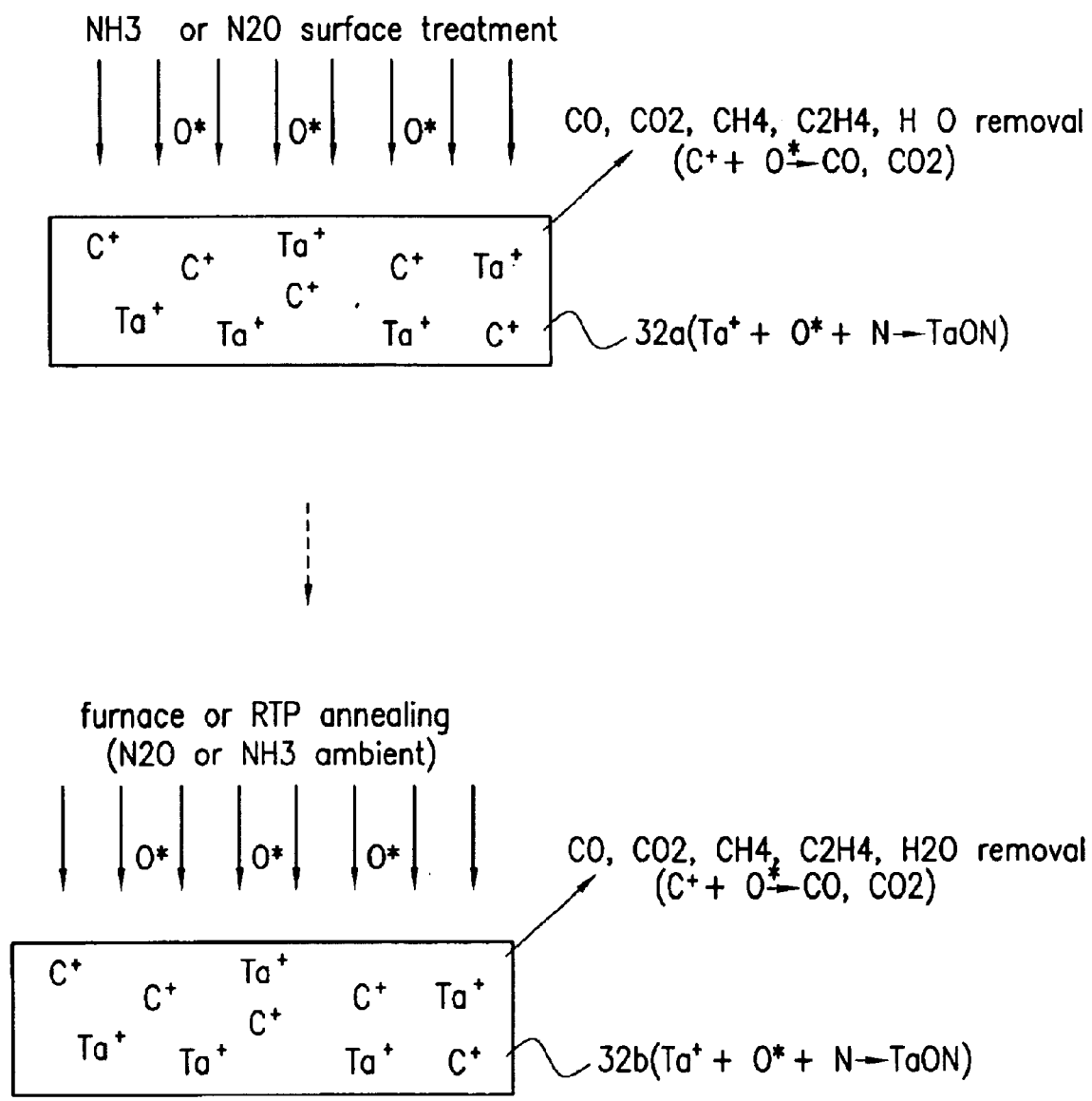
FIG. 5 is a schematic view illustrating a procedure for removing oxygen vacancies and carbon compounds by conducting an annealing process for a deposited TaON thin film of a multi-layer structure in accordance with the method of the present invention.

FIG. 5 illustrates a procedure for removing oxygen vacancies, carbon, and carbon compounds by conducting an annealing process for the deposited TaON thin film of a multi-layer structure according to the method of the present invention.

In order to allow the TaON thin film of a multi-layer structure to have a high density, the first amorphous TaON thin film 32a is subjected to an annealing process in an $NH_3$ or $N_2O$ atmosphere after the deposition thereof, thereby removing oxygen vacancies existing in the deposited amorphous TaON thin film and reducing or removing impurities such as carbon, carbon compounds, and $H_2O$ that were produced during the deposition of the amorphous TaON thin film, as shown in FIG. 5. This procedure also ensures that substantially all of the Ta atoms in the TaON film are completely oxidized.

Accordingly, volatile carbon compounds, such as CO, $CO_2$, $CH_4$, and $C_2H_4$, remaining in the first amorphous TaON thin film 32a are completely removed from the film. Also, the annealing process induces the deposited layer to crystallize, thereby suppressing a generation of leakage current.

After the second TaON thin film 32b is deposited over the first TaON thin film 32a, it is subjected under a $N_2O$ or $NH_3$ atmosphere, to an annealing process in an electric furnace for 5 to 60 minutes or to a rapid thermal process for 1 to 10 minutes. In accordance with this procedure, and as was the case with the first TaON thin film 32a, volatile carbon compounds and $H_2O$ in the second amorphous TaON thin film 32b are completely removed. Similarly, the second TaON thin film is induced to crystallize, thereby avoiding a generation of leakage current.

Thus, the first and second amorphous TaON thin films 32a and 32b provide a dielectric film having a high film quality after being subjected to the annealing processes that induce crystallization of the amorphous structure and remove carbon compounds.

Further, the deposition of the amorphous TaON thin films and the subsequent annealing of those deposited layers serve to eliminate structural defects, such as micro cracks and pin holes, at interfaces while producing a homogenous dielectric thin film.

As is apparent from the above description, the methods for fabricating capacitors for semiconductor devices in accordance with the present invention provide various effects.

That is, in accordance with the method of the present invention, the deposition of a TaON thin film and the annealing of the deposited thin film are repeated at least one time to form a dielectric film. Accordingly, it is possible to ensure the formation of a stable dielectric film having a dielectric constant much greater than that which can be obtained with conventional dielectric films.

In accordance with the present invention, it is also possible to solve problems such as the generation of leakage current by oxygen vacancies, organic impurities, and the unstable stoichiometry of conventional $Ta_2O_5$ dielectric films. Similarly, the present invention suppresses the generation of leakage current resulting from non-uniform oxidation at the interface between a polysilicon lower electrode and a $Ta_2O_5$ dielectric film present in conventional capacitors.

That is, in accordance with the present invention, it is possible to control and establish the equivalent oxide film thickness for the TaON dielectric film of 25 Å or less, as compared to conventional $Ta_2O_5$ dielectric films in a metal-insulator-silicon (MIS) structure. This makes it possible to obtain the high levels of capacitance required for the operation of DRAMs of grade 256 MB and higher.

In accordance with the present invention, the formation of the dielectric film is achieved by depositing a TaON thin film and treating the deposited film with a plasma process in an in-situ fashion in a LPCVD chamber. Accordingly, it is possible to eliminate the rapid thermal process conventionally conducted in a nitrogen atmosphere just prior to the deposition of conventional dielectric films. Further, it is possible to eliminate low-temperature and high-temperature thermal treatments typically conducted after the deposition of conventional dielectric films.

With the improved dielectric constant, the present invention can reduce the number of unit processing steps used and the processing time by rendering it unnecessary to use any process steps for increasing the surface area of lower electrodes to obtain a high dielectric constant. Accordingly, it is possible to reduce the manufacturing costs while improving productivity.

What is claimed is:

1. A method for fabricating a capacitor of a semiconductor device, the method comprising:
   forming a lower electrode on a semiconductor substrate;
   forming a dielectric layer on the lower electrode by
      nitriding an upper surface of the lower electrode using in-situ plasma before forming a first amorphous TaON thin film;
      forming the first amorphous TaON thin film on the lower electrode;
      annealing the first amorphous TaON thin film in an $NH_3$ atmosphere;
      forming a second amorphous TaON thin film on the lower electrode; and
      annealing the second amorphous TaON thin film to form a multilayer TaON dielectric film; and
   forming an upper electrode over the TaON dielectric film.

2. The method according to claim 1, wherein forming the lower electrode further comprises one of:
   1) forming a single conductive layer, the single conductive layer being formed from at least one material selected from a group consisting of doped polysilicon and metal, and
   2) forming a plurality of conductive layers, the plurality of conductive layers comprising at least two layers, the plurality of conductive layers being formed from at least one material selected from a group consisting of doped polysilicon and metal; and
   further wherein forming the upper electrode further comprises one of:
   1) forming a single conductive layer, the single conductive layer being formed from at least one material selected from a group consisting of doped polysilicon and metal, and
   2) forming a plurality of conductive layers, the plurality of conductive layers comprising at least two layers, the plurality of conductive layers being formed from at least one material selected from a group consisting of doped polysilicon and metal.

3. The method according to claim 2, wherein the metal may be selected from the group consisting of TiN, Ti, TaN, W, WN, WSi, Ru, $RuO_2$, Ir, and Pt.

4. The method according to claim 1, wherein forming the lower electrode further comprises forming a layer of doped polysilicon, the surface of the doped polysilicon being characterized by a hemispherical grain structure.

5. The method according to claim 1, wherein forming the lower electrode comprises forming a layer of polysilicon and further comprises removing a natural oxide film on the surface of the lower electrode before forming the first amorphous TaON thin film, the natural oxide film being removed by
an in-situ dry cleaning process, the dry cleaning process utilizing HF, $SiF_6$, or $NF_6$,
or an ex-situ wet cleaning process, the wet cleaning process utilizing an HF solution.

6. The method according to claim 5, wherein removing the natural oxide film further comprises cleaning the lower electrode with a $NH_4OH$ solution, $H_2SO_4$ solution, or a combination thereof.

7. The method according to claim 1, wherein forming the first amorphous TaON thin film further comprises depositing a first TaON thin film in a LPCVD chamber maintained at a temperature of not more than about 600° C.; and further wherein forming the second amorphous TaON thin film further comprises depositing a second TaON thin film in a LPCVD chamber maintained at a temperature of not more than about 600° C.

8. The method according to claim 7, wherein depositing the amorphous TaON thin films further comprises:

evaporating $Ta(OC_2H_5)_5$ in an evaporator maintained at a temperature of 150 to 200° C. to obtain a Ta-containing chemical vapor;

transporting the Ta-containing chemical vapor through a supply tube, the supply tube being maintained at a temperature of at least 150° C.; and injecting the $Ta(OC_2H_5)_5$ vapor into the LPCVD chamber.

9. The method according to claim 1, wherein forming at least one of the amorphous TaON thin films further comprises:

supplying a controlled quantity of the Ta-containing chemical vapor to the LPCVD chamber, the quantity being controlled by a mass flow controller;

supplying a controlled quantity of a reaction gas to the LPCVD chamber, the reaction gas comprising $NH_3$; and maintaining the LPCVD chamber within a temperature range between 300 and 600° C. and at a pressure of less than 10 Torr, to thereby induce a surface reaction between the Ta-containing chemical vapor and the reaction gas.

10. The method according to claim 9, wherein forming at least one of the amorphous TaON thin films further comprises:

supplying a controlled quantity of O2 gas to the LPCVD, the quantity ranging from 5 sccm to 500 sccm.

11. The method according to claim 9, wherein forming at least one of the amorphous TaON thin films further comprises:

spraying the Ta-containing chemical vapor into the LPCVD chamber through a gas distribution head and onto the lower electrode in a direction substantially perpendicular to the lower electrode.

12. The method according to claim 9, wherein forming at least one of the amorphous TaON thin films further comprises:

spraying the Ta-containing chemical vapor into the LPCVD chamber through an injector configured and arranged to establish a parabolic flow of the Ta-containing chemical vapor through the LPCVD chamber and onto the lower electrode.

13. The method according to claim 12, wherein forming at least one of the amorphous TaON thin films further comprises spraying the Ta-containing chemical vapor into the LPCVD chamber through a first injector; and spraying the reaction gas into the LPCVD chamber through a second injector, the first and second injectors being configured and arranged to establish a countercurrent flow of the gas and the vapor through the LPCVD chamber and onto the lower electrode.

14. The method according to claim 1, wherein the annealing steps further comprise a plasma treatment in an $NH_3$ or $N_2O$ atmosphere.

15. The method according to claim 1, wherein the annealing steps further comprise a low-temperature annealing process in a $UV-O_3$ or $O_3$ atmosphere.

16. The method according to claim 1, wherein the annealing steps further comprise heating the amorphous TaON thin film to a temperature between 650 and 950° C. under an atmosphere of $N_2O$, $O_2$, or $N_2$.

17. The method according to claim 1 wherein the step of nitriding an upper surface of the lower electrode using in-situ plasma is applied under an $NH_3$ atmosphere for 1 to 5 minutes.

18. The method according to claim 1 wherein forming the lower electrode further comprises treating the surface of the lower electrode with a plasma in an $N_2O$ atmosphere to form a thin, homogeneous, oxide layer before forming the first amorphous TaON thin film.

19. A method for fabricating capacitors for semiconductor devices, comprising:

forming a lower electrode on a semiconductor substrate;

nitriding an upper surface of the lower electrode in an $NH_3$ atmosphere;

forming a first amorphous TaON thin film over the lower electrode;

annealing the first amorphous TaON thin film in an $NH_3$ atmosphere;

forming a second amorphous TaON thin film;

annealing the second amorphous TaON thin film at least once, thereby forming a TaON dielectric film having a multi-layer structure; and forming an upper electrode over the TaON dielectric film.

* * * * *